United States Patent
Huang et al.

(10) Patent No.: US 9,312,464 B2
(45) Date of Patent: Apr. 12, 2016

(54) FLIP CHIP PACKAGE STRUCTURE AND WAFER LEVEL PACKAGE STRUCTURE

(71) Applicant: PlayNitride Inc., Tainan (TW)

(72) Inventors: Shao-Hua Huang, Tainan (TW); Chih-Ling Wu, Tainan (TW); Yu-Yun Lo, Tainan (TW); Tzu-Yang Lin, Tainan (TW); Yu-Hung Lai, Tainan (TW)

(73) Assignee: PlayNitride Inc., Tainan (TW)

( * ) Notice: Subject to any disclaimer, the term of this patent is extended or adjusted under 35 U.S.C. 154(b) by 0 days.

(21) Appl. No.: 14/716,900

(22) Filed: May 20, 2015

(65) Prior Publication Data

US 2015/0380618 A1    Dec. 31, 2015

(30) Foreign Application Priority Data

Jun. 27, 2014 (TW) .............................. 103122302 A

(51) Int. Cl.
| | |
|---|---|
| *H01L 33/00* | (2010.01) |
| *H01L 33/62* | (2010.01) |
| *H01L 25/075* | (2006.01) |
| *H01L 33/38* | (2010.01) |
| *H01L 33/48* | (2010.01) |

(52) U.S. Cl.
CPC ............ *H01L 33/62* (2013.01); *H01L 25/0753* (2013.01); *H01L 33/382* (2013.01); *H01L 33/483* (2013.01)

(58) Field of Classification Search
CPC ..... H01L 31/143; H01L 31/162; H01L 33/00; H01L 51/50
USPC .......................................................... 257/92
See application file for complete search history.

(56) References Cited

U.S. PATENT DOCUMENTS

2013/0049036 A1*   2/2013   Jeong .................... H01L 27/153
                                                                257/91

* cited by examiner

*Primary Examiner* — Hoai V Pham
(74) *Attorney, Agent, or Firm* — Jianq Chyun IP Office

(57) ABSTRACT

A flip chip package structure includes a package base and a LED chip. The package base includes a first substrate, a first and a second electrodes disposed on the first substrate and a bonding layer disposed on the first substrate. The LED chip is flipped on the package base and includes an epitaxy layer, a third and a fourth electrodes disposed on the epitaxy layer and contacting the first and the second electrodes, a second insulating layer disposed between the third and the fourth electrodes, and a plurality of bonding pillars disposed on the second insulating layer and contacting the bonding layer. A minimum interval between the bonding layer, the first and the second electrodes and a minimum interval between the bonding pillars, the second and the third electrodes are larger than a width of each bonding pillar.

17 Claims, 4 Drawing Sheets

FLIP CHIP PACKAGE STRUCTURE AND WAFER LEVEL PACKAGE STRUCTURE

CROSS-REFERENCE TO RELATED APPLICATION

This application claims the priority benefit of Taiwan application serial no. 103122302, filed on Jun. 27, 2014. The entirety of the above-mentioned patent application is hereby incorporated by reference herein and made a part of this specification.

BACKGROUND OF THE INVENTION

1. Field of the Invention

The invention relates to a flip chip package structure and a wafer level package structure, and particularly relates to a flip chip package structure and a wafer level package structure having a greater alignment tolerance.

2. Description of Related Art

Common bonding technologies for light emitting diodes include bonding wire and flip chip. In addition, the flip chip bonding technology is known for its characteristics of reducing the size of chip package and reducing the path for signal transmission. Thus, the technology has been broadly applied in the package of light emitting diode.

FIG. 1 is a schematic view illustrating a conventional flip chip package structure. Referring to FIG. 1, a conventional flip chip package structure 10 includes a package base 20 and a light emitting diode chip 30. The package base 20 includes a first substrate 21, a first electrode 22, a second electrode 23, and a first insulating layer 24. The first electrode 22, the second electrode 23, and the first insulating layer 24 are disposed on the first substrate 21, and the first insulating layer 24 are located between the first electrode 22 and the second electrode 23. The light emitting diode chip 30 includes a second substrate 31, an epitaxy layer 32, a third electrode 33, a fourth electrode 34, and a second insulating layer 35. The epitaxy layer 32 is disposed on the second substrate 31, and the third electrode 33, the fourth electrode 34, and the second insulating layer 35 are located on the epitaxy layer 32. The light emitting diode chip 30 is flipped on the package base 20, the first electrode 22 contacts the third electrode 33, and the second electrode 23 contacts the fourth electrode 34, making the light emitting diode chip 30 and the package base 20 electrically connected.

When the light emitting diode 30 is aligned to the package base 20, contact of the first electrode 22 to the fourth electrode 34 or contact of the second electrode 23 to the third electrode 33 needs to be prevented. One solution to prevent such contacts is to increase an interval between the first electrode 22 and the second electrode 23 and an interval between the third electrode 33 and the fourth electrode 34 to increase tolerance to an alignment error of the conventional flip chip package structure 10. However, increasing the interval between the first electrode 22 and the second electrode 23 and the interval between the third electrode 33 and the fourth electrode 34 makes a bonding region between the package base 20 and the light emitting diode chip 30 (i.e. a middle region in FIG. 1) smaller, making a structural strength of the flip chip package structure 10 reduced and thus increasing the change of failure of the flip chip package structure 10.

SUMMARY OF THE INVENTION

The invention provides a flip chip package structure having a greater tolerance to an alignment error and capable of maintaining a bonding region between a package base and a light emitting diode chip.

The invention provides a wafer level package structure having a plurality of the flip chip package structures.

A flip chip package structure includes a package base and a light emitting diode chip. The package base includes a first substrate, a first electrode, a second electrode, and a bonding layer. The first electrode is disposed on a part of the first substrate. The second electrode is disposed on a part of the first substrate and kept a distance from the first electrode. The bonding layer is disposed on a part of the first substrate. The light emitting diode chip is flipped on the package base and electrically connected with the package base. The light emitting diode chip includes an epitaxy layer, a third electrode, a fourth electrode, at least one second insulating layer, and a plurality of bonding pillars. The third electrode is disposed on a part of the epitaxy layer and contacts the first electrode. The fourth electrode is disposed on a part of the epitaxy layer and contacts the second electrode. In addition, the fourth electrode is kept a distance from the third electrode. The second insulating layer is disposed on a part of the epitaxy layer and located between the third electrode and the fourth electrode. The bonding pillars are disposed on the at least one second insulating layer, and at least a part of the bonding pillars contact the bonding layer. The minimum interval between the bonding layer and the first electrode and a minimum interval between the bonding layer and the second electrode are greater than a width of each of the bonding pillars, and a minimum interval between the bonding pillars and the third electrode and a minimum interval between the bonding pillars and the fourth electrode are greater than the width of each of the bonding pillars.

According to an embodiment of the invention, the package base further includes a first insulating layer disposed between the first substrate and the bonding layer, and located between the first electrode and the second electrode.

According to an embodiment of the invention, a material of each of the bonding pillars is metal, and a material of the bonding layer is metal.

According to an embodiment of the invention, the light emitting diode chip further includes a second substrate, and the third electrode, the fourth electrode, and the second insulating layer are disposed on one surface of the epitaxy layer, and the second substrate contacts the other surface of the epitaxy layer.

According to an embodiment of the invention, the at least one second insulating layer is a plurality of second insulating layers separated from each other, and each of the second insulating layers is connected to one of the bonding pillars.

According to an embodiment of the invention, one side of the bonding layer away from the first insulating layer is substantially aligned with one side of the first electrode away from the first substrate, and one end of each of the bonding pillars away from the at least one second insulating layer is substantially aligned with one side of the third electrode away from the epitaxy layer.

According to an embodiment of the invention, the first and third electrodes are P-type electrodes, and the second and fourth electrodes are N-type electrodes.

According to an embodiment of the invention, the first substrate includes a first surface and a second surface opposite to each other and a plurality of conductive through holes penetrating from the first surface to the second surface, the first electrode and the second electrode are disposed on the first surface and connected to the conductive through holes, and the package base further includes a first pad and a second pad disposed on the second surface and connected to the conductive through holes.

A flip chip package structure includes a package base and a light emitting diode chip. The package base includes a first substrate, a first electrode, a second electrode, and a metal bonding layer. The first electrode is disposed on a part of the first substrate. The second electrode is disposed on a part of the first substrate and kept a distance from the first electrode. The metal bonding layer is disposed on a part of the first substrate, and the metal bonding layer does not contact the first electrode and the second electrode. The light emitting diode chip is flipped on the package base and electrically connected with the package base. The light emitting diode chip includes a second substrate, an epitaxy layer, a third electrode, a fourth electrode, at least one second insulating layer, and a plurality of metal bonding pillars. The third electrode is disposed on a part of the epitaxy layer and contacts the first electrode. The fourth electrode is disposed on a part of the epitaxy layer and contacts the second electrode. In addition, the fourth electrode is kept a distance from the third electrode. The second insulating layer is disposed on a part of the epitaxy layer and located between the third electrode and the fourth electrode. The plurality of metal bonding pillars are disposed on the second insulating layer and do not contact the third electrode and the fourth electrode. At least a part of the metal bonding pillars contact the metal bonding layer.

According to an embodiment of the invention, the package base further includes a first insulating layer disposed between the first substrate and the metal bonding layer, and located between the first electrode and the second electrode.

According to an embodiment of the invention, the light emitting diode chip further includes a second substrate, and the third electrode, the fourth electrode, and the second insulating layer are disposed on one surface of the epitaxy layer, and the second substrate contacts the other surface of the epitaxy layer.

According to an embodiment of the invention, the at least one second insulating layer is a plurality of second insulating layers separated from each other, and each of the second insulating layers is connected to one of the metal bonding pillars.

According to an embodiment of the invention, one side of the metal bonding layer away from the first insulating layer is substantially aligned with one side of the first electrode away from the first substrate, and one end of each of the metal bonding pillars away from the at least one second insulating layer is substantially aligned with one side of the third electrode away from the epitaxy layer.

According to an embodiment of the invention, the first and third electrodes are P-type electrodes, and the second and fourth electrodes are N-type electrodes.

According to an embodiment of the invention, the first substrate includes a first surface and a second surface opposite to each other and a plurality of conductive through holes penetrating from the first surface to the second surface, the first electrode and the second electrode are disposed on the first surface and connected to the conductive through holes, and the package base further includes a first pad and a second pad disposed on the second surface and connected to the conductive through holes.

A wafer level package structure of the invention includes a plurality of the flip chip package structures.

Based on the above, the bonding layer is disposed on the first insulating layer of the package base, and the bonding pillars are disposed on the second insulating layer in the light emitting diode chip in the flip chip package structure and the wafer level package structure of the invention. Thus, the distance between the first electrode and the second electrode as well as the distance between the third electrode and the fourth electrode are increased, making it difficult for the first electrode to contact the fourth electrode or for the second electrode to contact the third electrode. In other words, the requirement on alignment accuracy when the light emitting diode chip and the package base are bonded becomes lower and more easy to satisfy. Besides, when the light emitting diode chip is bonded to the package base, a certain bonding region between the light emitting diode chip and the package base may be maintained because the bonding layer is connected to at least a part of the bonding pillars and a part of the region between the first electrode and the second electrode as well as the third electrode and the fourth electrode. Consequently, the chance that the flip chip package structure fails due to the smaller bonding region between the light emitting diode chip and the package base is reduced.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
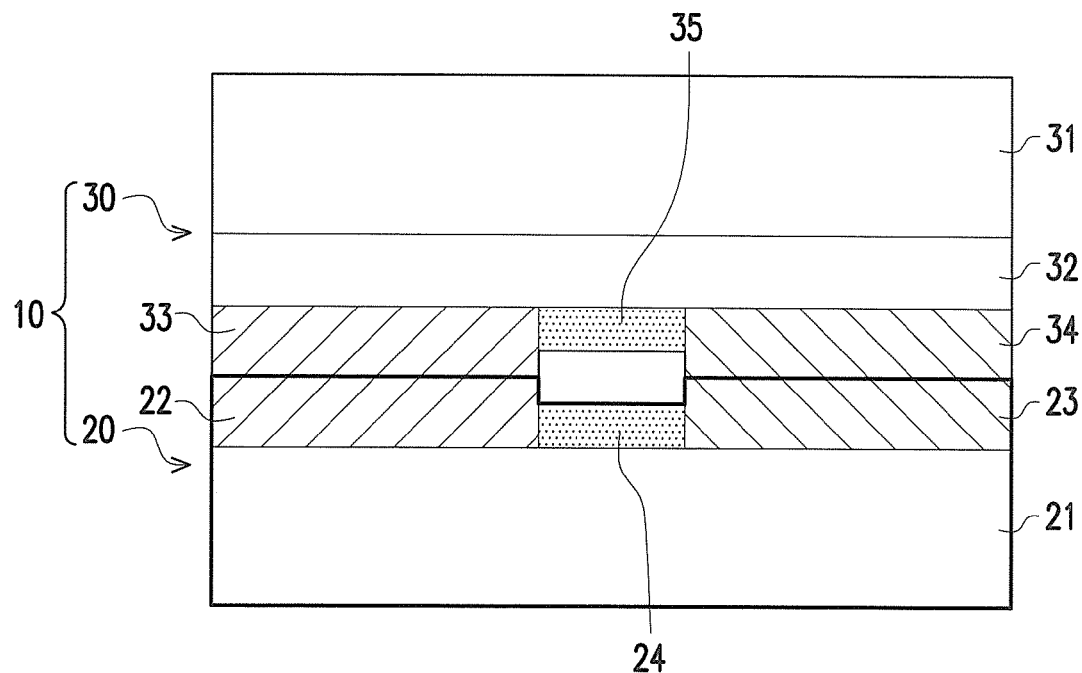
FIG. 1 is a schematic view illustrating a conventional flip chip package structure.

Reference will now be made in detail to the present preferred embodiments of the invention, examples of which are illustrated in the accompanying drawings.

Wherever possible, the same reference numbers are used in the drawings and the description to refer to the same or like parts.

Figure 2:
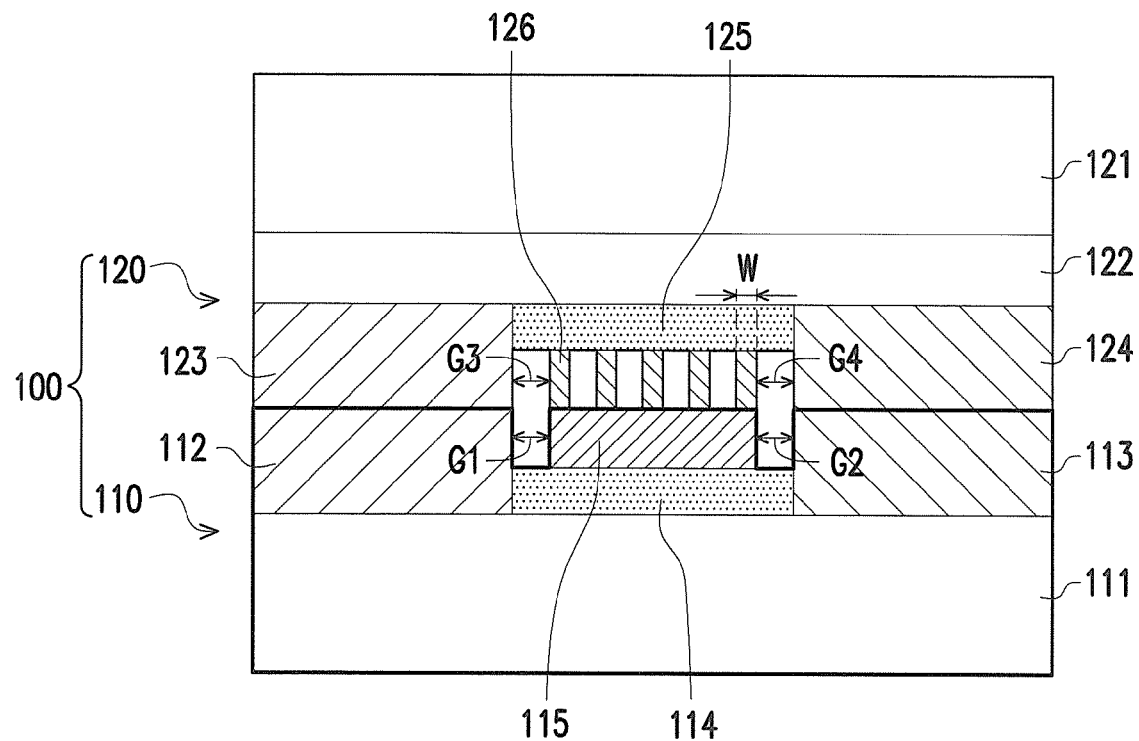
FIG. 2 is a schematic view illustrating a flip chip package structure according to an embodiment of the invention.

FIG. 2 is a schematic view illustrating a flip chip package structure according to an embodiment of the invention. Referring to FIG. 2, a flip chip package structure 100 of this embodiment includes a package base 110 and a light emitting diode chip 120 flipped on the package base 110 and electrically connected with the package base 110.

The package base 110 includes a first substrate 111, a first electrode 112, a second electrode 113, a first insulating layer 114, and a bonding layer 115. The first electrode 112 and the second electrode 113 are respectively disposed on a part of the first substrate 111, and a distance is kept between the first electrode 112 and the second electrode 113. In this embodiment, the first electrode 112 is a P-type electrode, and the second electrode 113 is an N-type electrode. The first insulating layer 114 is disposed on the first substrate 111 and located between the first electrode 112 and the second electrode 113. The bonding layer 115 is disposed on a part of the first insulating layer 114. In this embodiment, a material of the bonding layer 115 is metal, and distances are respectively kept between the bonding layer 115 and the first electrode 112 and between the bonding layer 115 and the second electrode 113, making the bonding layer 115 not conductive to the first electrode 112 and the second electrode 113.

The light emitting diode chip 120 includes a second substrate 121, an epitaxy layer 122, a third electrode 123, a fourth electrode 124, at least one second insulating layer 125, and a plurality of bonding pillars 126. The epitaxy layer 122 is disposed on the second substrate 121. The third electrode 123 and the fourth electrode 124 are respectively disposed on a part of the epitaxy layer 122, and a distance is kept between the third electrode 123 and the fourth electrode 124. In this embodiment, the third electrode 123 is a P-type electrode, and the fourth electrode 124 is an N-type electrode. In this embodiment, the at least one second insulating layer 125 is one second insulating layer 125. The second insulating layer 125 is disposed on a part of the epitaxy layer 122 and located between the third electrode 123 and the fourth electrode 124 to separate the third electrode 123 and the fourth electrode 124. The bonding pillars 126 are disposed on a part of the second insulating layer 125, and distances are respectively kept between the bonding pillars 126 and the third electrode 123 and between the bonding pillars 126 and the fourth electrode 124 respectively. Thus, none of the bonding pillars 126 is conductive to the first electrode 123 and the second electrode 124.

Figure 3:
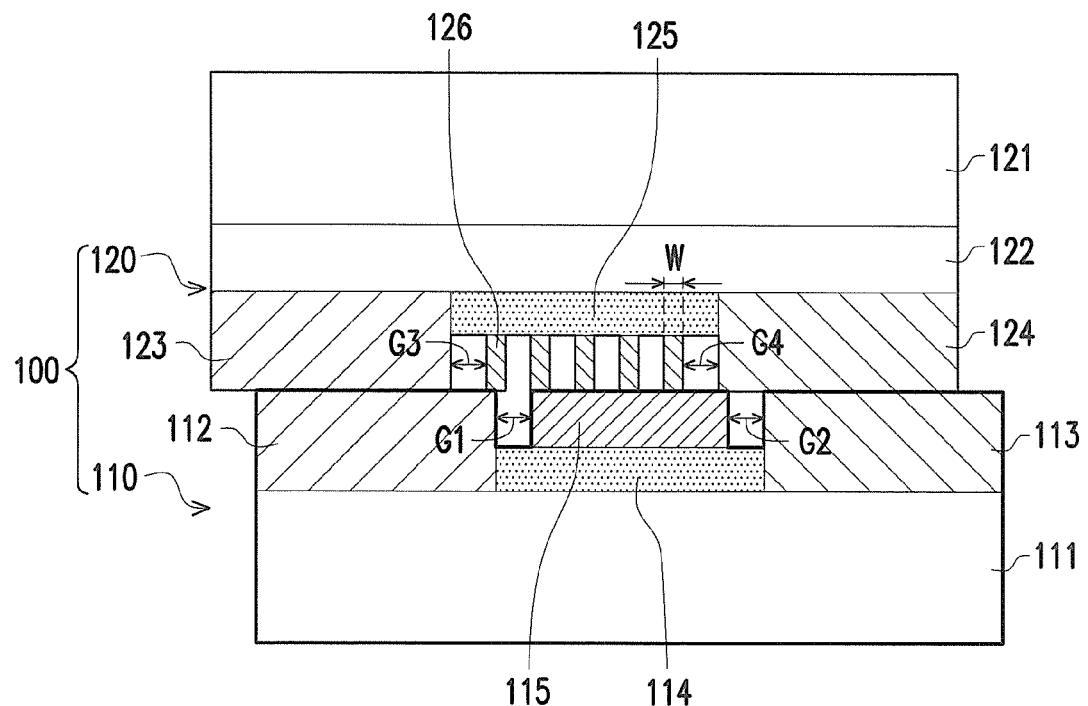
FIG. 3 is a schematic view illustrating an alignment error of the flip chip package structure shown in FIG. 2.

As shown in FIG. 2, under an ideal alignment condition, the first electrode 112 only contacts the third electrode 123, and the second electrode 113 only contacts the fourth electrode 124 after the light emitting diode chip 120 is flipped on and packaged to the package base 110. However, due to limitation of the manufacturing process, there may be an alignment error when the light emitting diode chip 120 is packaged to the package base 110. FIG. 3 is a schematic view illustrating an alignment error of the flip chip package structure shown in FIG. 2. Referring to FIG. 3, in fact, the light emitting diode chip 120 is slightly deviated from the package base 110 when flipped on the package base 110 due to the alignment error. It should be noted that the deviation between the light emitting diode chip 120 and the package base 110 is intentionally signified in the illustration of FIG. 3 to saliently indicate the alignment error between the light emitting diode chip 120 and the package base 110. However, the deviation between the light emitting diode chip 120 and the package base 110 in practice should be smaller than the error indicated in FIG. 3.

To avoid a circumstance that the first electrode 112 is conductive to the fourth electrode 124 or the second electrode 113 is conductive to the third electrode 123 due to the alignment error, the distance between the first electrode 112 and the second electrode 113 and the distance between third electrode 123 and the fourth electrode 124 are intentionally increased to increase tolerance to the alignment error between the light emitting diode chip 120 and the package base 110. In other words, since the distance between the first electrode 112 and the second electrode 113 is increased and the distance between the third electrode 123 and the fourth electrode 124 is increased, it is not likely that the first electrode 112 is conductive to the fourth electrode 124 or the second electrode 113 is conductive to the third electrode 123 even if the light emitting diode chip 120 is slightly deviated when being packaged to the package base 110.

In addition, to prevent a circumstance that a bonding region between the package base 110 and the light emitting diode chip 120 is reduced because the distance between the first electrode 112 and the second electrode 113 as well as the distance between the third electrode 123 and the fourth electrode 124 are increased, making the flip chip package structure 100 have a weaker strength and thus failed, the bonding layer 115 formed of metal is disposed in a region between the first electrode 112 and the second electrode 113, and the bonding pillars 126 formed of metal are disposed in a region between the third electrode 123 and the fourth electrode 124 in this embodiment.

When the light emitting diode chip 120 is packaged to the package base 110, the bonding layer 115 still contacts at least a part of the bonding pillars 126 even if the alignment is slightly deviated. Thus, the bonding layer 115 and the bonding pillars 126 still offer a certain bonding region between the light emitting diode chip 120 and the package base 110 in addition to bonding between the first electrode 112 and the third electrode 123 as well as the second electrode 113 and the fourth electrode 124. In this way, a structural strength of the flip chip package structure 100 may be maintained.

More specifically, since the bonding layer 115 and the bonding pillars 126 are formed of metal, in order to prevent a circumstance that the light emitting diode chip 120 is slightly deviated when being packaged to the package base 110, making the first electrode 112 contact the bonding pillars 126 and the fourth electrode 124 contact the bonding layer 115, or making the second electrode 113 contact the bonding pillars 126 and the third electrode 123 contact the bonding layer 115, such that the first electrode 112 and the fourth electrode 124 are conductive through the bonding layer 115 and the bonding pillars 126 or the second electrode 113 and the third electrode 123 are conductive through the bonding layer 115 and the bonding pillars 126, a minimum interval between the bonding layer 115 and the first electrode 112 and a minimum interval between the bonding layer 115 and the second electrode 113 are greater than a width of each of the bonding pillars 126. In addition, a minimum interval between the bonding pillars 126 and the third electrode 123 and a minimum interval between the bonding pillars 126 and the fourth electrode 124 are greater than a width of each of the bonding pillars 126.

Specifically, when the light emitting diode chip 120 is slightly deviated when being packaged to the package base 110, as shown in FIG. 3, the first electrode 112 may contact the bonding pillars 126, and the fourth electrode 124 may contact the bonding layer 115. Since an interval G1 between the bonding layer 115 and the first electrode 112 and a minimum interval G3 between the bonding pillars 126 and the third electrode 123 are greater than a width W of the bonding pillar 126, the bonding pillar 126 (the leftmost bonding pillar 126 in FIG. 3) contacting the first electrode 112 does not contact the bonding layer 115 underneath. Therefore, the circumstance that the first electrode 112 and the fourth electrode 124 are conductive through the bonding layer 115 and the bonding pillars 126 may be prevented.

It should be noted that although in this embodiment, the interval G1 between the bonding layer 115 and the first electrode 112, an interval G2 between the bonding layer 115 and the second electrode 113, the minimum interval G3 between the bonding pillars 126 and the third electrode 123, and a minimum interval G4 between the bonding pillars 126 and the fourth electrode 124 have the same width, the widths of intervals G1, G2, G3, and G4 may be different in other embodiments, as long as the widths of intervals G1, G2, G3, and G4 are respectively greater than the width W of the bonding pillar 126.

In addition, in this embodiment, a total thickness of the first insulating layer 114 and the bonding layer 115 is substantially equivalent to a thickness of the first electrode 112 or the second electrode 113, and a total thickness of the second insulating layer 125 and the bonding pillar 126 is substantially equivalent to a thickness of the third electrode 123 or the fourth electrode 124, such that one side of the bonding layer 115 away from the first insulating layer 114 is substantially aligned with one side of the first electrode 112 or the second electrode 113 away from the first substrate 111, and one end of each of the bonding pillars 126 away from the second insulating layer 125 is substantially aligned with one side of the third electrode 123 or the fourth electrode 124 away from the epitaxy layer 122. However, in other embodiments, the side of the bonding layer 115 away from the first insulating layer 114 may be higher or lower than the side of the first electrode 112 away from the first substrate 111, and the end of each of the bonding pillars 126 away from the second insulating layer 125 may be lower or higher than the side of the third electrode 123 away from the epitaxy layer 122. It is only necessary that the bonding layer 115 is bonded to at least a part of the bonding pillars 126 when the first electrode 112 is bonded to the third electrode 123 and the second electrode 113 is bonded to the fourth electrode 124.

The flip chip package structure 100 of this embodiment allows a greater alignment error between the light emitting diode chip 120 and the package base 110 by increasing the distance between the first electrode 112 and the second electrode 113 as well as the distance between the third electrode 123 and the fourth electrode 124. In addition, a certain bonding region is maintained between the light emitting diode chip 120 and the package base 110 by using the bonding layer 115 and the bonding pillars 126, thereby providing the structural strength. Besides, the interval G1 between the bonding layer 115 and the first electrode 112, the interval G2 between the bonding layer 115 and the second electrode 113, the minimum interval G3 between the bonding pillars 126 and the third electrode 123, and the minimum interval G4 between the bonding pillars 126 and the fourth electrode 124 are set to be respectively greater than the width W of the bonding pillar 126, thereby preventing the first electrode 112 and the fourth electrode 124 being conductive or the second electrode 113 and the third electrode 123 being conductive through the bonding layer 115 of the bonding pillars 126.

Figure 4:
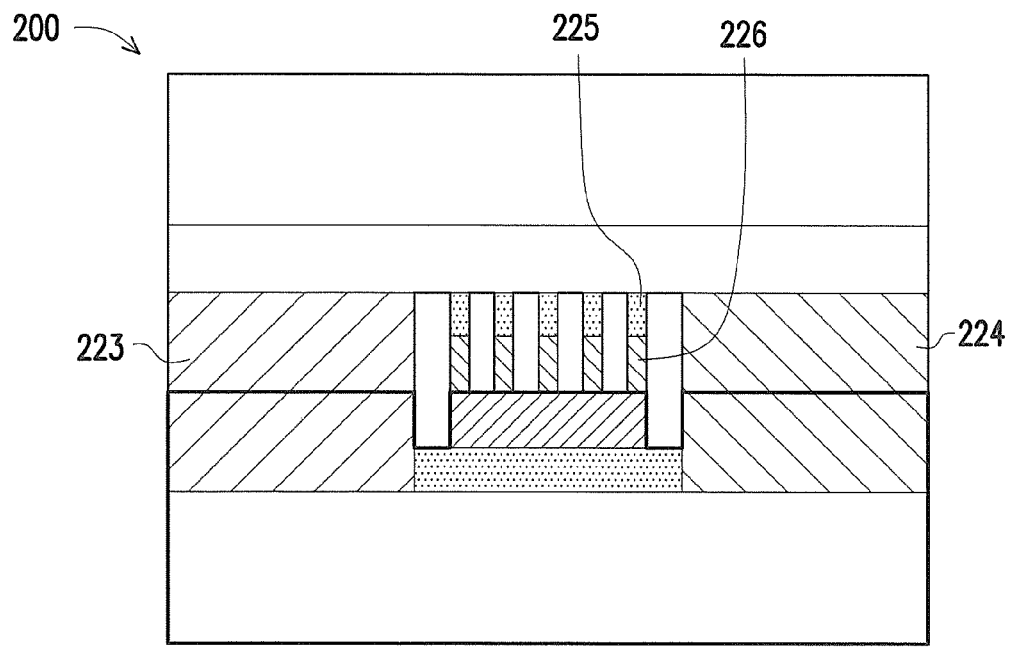
FIG. 4 is a schematic view illustrating a flip chip package structure according to another embodiment of the invention.

FIG. 4 is a schematic view illustrating a flip chip package structure according to another embodiment of the invention. Referring to FIG. 4, a flip chip package structure 200 shown in FIG. 4 mainly differs from the flip chip package structure 100 shown in FIG. 2 in that in FIG. 2, the light emitting diode chip 120 only has one second insulating layer 125, and two sides of the second insulating layer 125 respectively contact the third electrode 123 and the fourth electrode 124. In FIG. 4, at least one second insulating layer 225 of the flip chip package structure 200 is a plurality of second insulating layers 225 separated from each other. In addition, each of the second insulating layers 225 is connected to one of bonding pillars 226. In addition, the second insulating layers 225 are respectively separated from the third electrode 223 and the fourth electrode 224.

Figure 5:
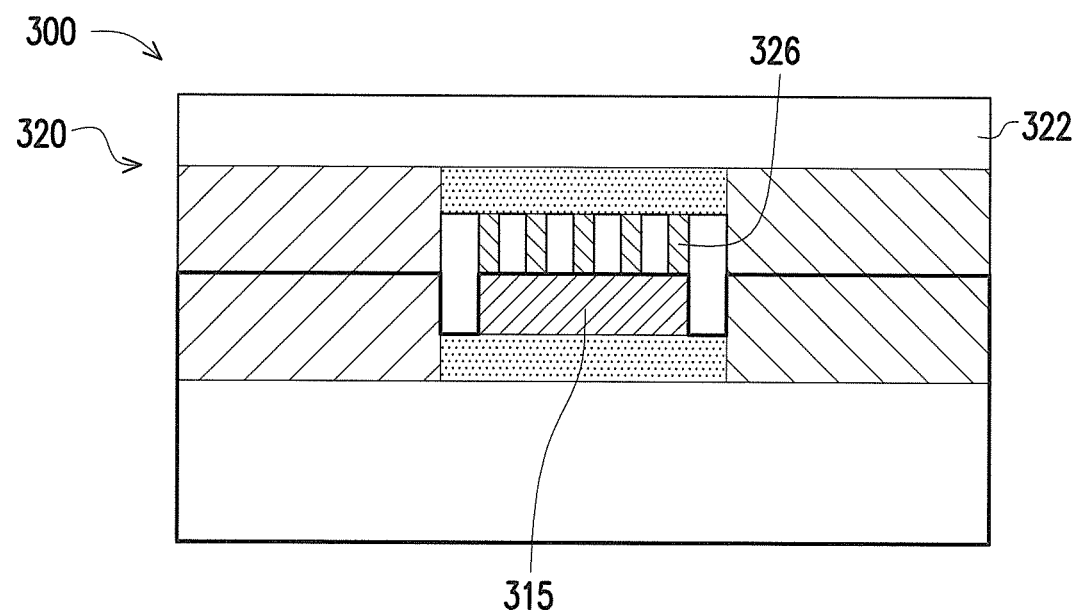
FIG. 5 is a schematic view illustrating a flip chip package structure according to still another embodiment of the invention.

FIG. 5 is a schematic view illustrating a flip chip package structure according to still another embodiment of the invention. Referring to FIG. 5, a flip chip package structure 300 shown in FIG. 5 mainly differs from the flip chip package structure 100 shown in FIG. 2 in that a light emitting diode chip 320 in the flip chip package structure 300 shown in FIG. 5 omits the second substrate. Since an epitaxy layer 322 is very thin, a design of a bonding layer 315 and bonding pillars 326 in this embodiment allows a middle region of the flip chip package structure 300 to be effectively supported, thereby preventing cracking of the epitaxy layer 322 in the middle region due to a stress.

Figure 6:
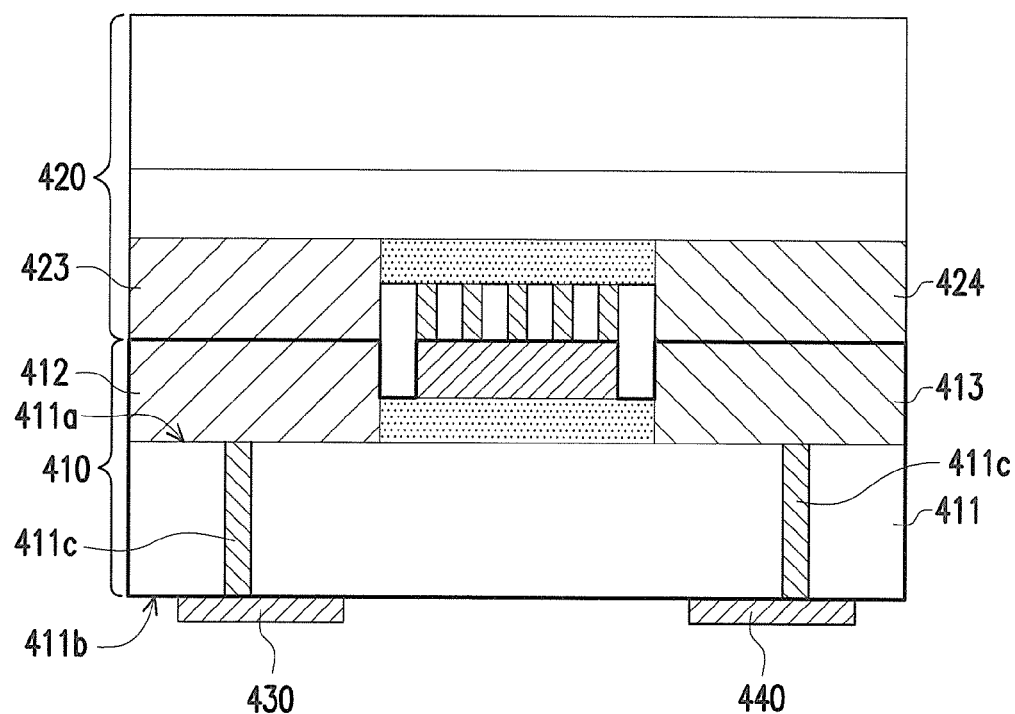
FIG. 6 is a schematic view illustrating a flip chip package structure according to still another embodiment of the invention.

FIG. 6 is a schematic view illustrating a flip chip package structure according to still another embodiment of the invention. Referring to FIG. 6, a flip chip package structure 400 shown in FIG. 6 mainly differs from the flip chip package structure 100 shown in FIG. 2 in that in the flip chip package structure 400 shown in FIG. 6, a first substrate 411 includes a first surface 411a and a second surface 411b opposite to each other, and a plurality of conductive through holes 411c penetrating from the first surface 411a to the second surface 411b. A first electrode 412 and a second electrode 413 are disposed on the first surface 411a and connected to the conductive through holes 411c, and a package base 410 further includes a first pad 430 and a second pad 440 disposed on the second surface 411b and connected to the conductive through holes 411c. A third electrode 423 and a fourth electrode 424 of a light emitting diode chip 420 respectively contact the first electrode 412 and the second electrode 413, and are electrically connected to the first pad 430 and the second pad 440 through the conductive through holes 411a, so as to be connected to an external circuit (not shown).

It should be noted that the flip chip package structures 100, 200, 300, and 400 in the above embodiments are described as example, and the structure of the flip chip package structure is not limited thereto.

Figure 7:
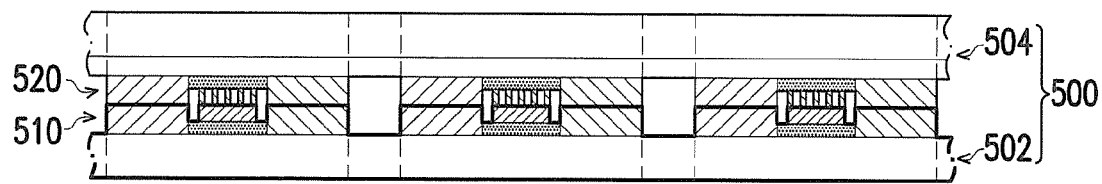
FIG. 7 is a partial schematic view illustrating a wafer level package structure according to an embodiment of the invention.

FIG. 7 is a partial schematic view illustrating a wafer level package structure according to an embodiment of the invention. Referring to FIG. 7, for an illustrative purpose, only a part of a wafer level package structure 500 is shown in FIG. 7. The wafer level package structure 500 of this embodiment includes a carrier 502 and a wafer 504 flipped on the carrier 502. Unlike the packaging technology using a single die as a processing target, the wafer level package targets at packaging the wafer 504 to simplify the packaging process of dies and reduce time and cost.

Specifically speaking, in this embodiment, after manufacture of integrated circuits on the wafer 504 is completed, the wafer 504 has a plurality of light emitting diode chips 520, and the carrier 502 has a plurality of package bases 510 disposed thereon. During packaging, it only needs to align the light emitting diode chips 520 on the wafer 504 to the package bases 510 on the carrier 502 to directly perform a package process to the whole wafer 504, and perform a wafer saw process to the wafer 504. With the processes, the plurality of flip chip package structures 100 may be formed respectively. In this embodiment, the wafer level package structure 500 is described as being used to manufacture the plurality of flip chip package structures 100 as an example. However, in other embodiments, the wafer level package structure 500 may be used to manufacture the flip chip package structures 200, 300, and 400 in other embodiments. The invention is not limited thereto.

In view of the foregoing, the bonding layer is disposed on the first insulating layer of the package base, and the bonding pillars are disposed on the second insulating layer in the light emitting diode chip in the flip chip package structure and the wafer level package structure of the invention. Thus, the distance between the first electrode and the second electrode as well as the distance between the third electrode and the fourth electrode are increased, making it difficult for the first electrode to contact the fourth electrode or for the second electrode to contact the third electrode. In other words, the requirement on alignment accuracy when the light emitting diode chip and the package base are bonded becomes lower and easier to satisfy. Besides, when the light emitting diode chip is bonded to the package base, a certain bonding region between the light emitting diode chip and the package base may be maintained because the bonding layer is connected to at least a part of the bonding pillars and a part of the region between the first electrode and the second electrode as well as the third electrode and the fourth electrode. Consequently, the chance that the flip chip package structure fails due to the smaller bonding region between the light emitting diode chip and the package base is reduced. Besides, by setting the interval between the bonding layer and the first electrode, the interval between the bonding layer and the second electrode, the minimum interval between the bonding pillars and the third electrode, and the minimum interval between the bonding pillars and the fourth electrode to be respectively greater than the width of the bonding pillar, the conduction between the first electrode and the fourth electrode or the conduction between the second electrode and the third electrode through the bonding layer and the bonding pillars is prevented.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:
1. A flip chip package structure, comprising:
   a package base, comprising:
      a first substrate;
      a first electrode, disposed on a part of the first substrate;
      a second electrode, disposed on a part of the first substrate and kept a distance from the first electrode; and
      a bonding layer, disposed on a part of the first substrate; and
   a light emitting diode chip, flipped on the package base and electrically connected with the package base, wherein the light emitting diode chip comprises:
      an epitaxy layer;
      a third electrode, disposed on a part of the epitaxy layer and contacting the first electrode;
      a fourth electrode, disposed on a part of the epitaxy layer and contacting the second electrode, wherein the fourth electrode is kept a distance from the third electrode;
      at least one second insulating layer, disposed on a part of the epitaxy layer and located between the third electrode and the fourth electrode; and
      a plurality of bonding pillars, disposed on the at least one second insulating layer, at least a part of the bonding pillars contacting the bonding layer, wherein:
      a minimum interval between the bonding layer and the first electrode and a minimum interval between the bonding layer and the second electrode are greater than a width of each of the bonding pillars, and a minimum interval between the bonding pillars and the third electrode and a minimum interval between the bonding pillars and the fourth electrode are greater than the width of each of the bonding pillars.

2. The flip chip package structure as claimed in claim 1, wherein the package base further comprises a first insulating layer disposed between the first substrate and the bonding layer, and located between the first electrode and the second electrode.

3. The flip chip package structure as claimed in claim 1, wherein a material of each of the bonding pillars is metal, and a material of the bonding layer is metal.

4. The flip chip package structure as claimed in claim 1, wherein the light emitting diode chip further comprises a second substrate, and the third electrode, the fourth electrode, and the second insulating layer are disposed on one surface of the epitaxy layer, and the second substrate contacts the other surface of the epitaxy layer.

5. The flip chip package structure as claimed in claim 1, wherein the at least one second insulating layer is a plurality of second insulating layers separated from each other, and each of the second insulating layers is connected to one of the bonding pillars.

6. The flip chip package structure as claimed in claim 1, wherein one side of the bonding layer away from the first insulating layer is substantially aligned with one side of the first electrode away from the first substrate, and one end of each of the bonding pillars away from the at least one second insulating layer is substantially aligned with one side of the third electrode away from the epitaxy layer.

7. The flip chip package structure as claimed in claim 1, wherein the first and third electrodes are P-type electrodes, and the second and fourth electrodes are N-type electrodes.

8. The flip chip package structure as claimed in claim 1, wherein the first substrate comprises a first surface and a second surface opposite to each other and a plurality of conductive through holes penetrating from the first surface to the second surface, the first electrode and the second electrode are disposed on the first surface and connected to the conductive through holes, and the package base further comprises a first pad and a second pad disposed on the second surface and connected to the conductive through holes.

9. A wafer level package structure, comprising a plurality of the flip chip package structures as claimed in claim 1.

10. A flip chip package structure, comprising:
    a package base, comprising:
       a first substrate;
       a first electrode, disposed on a part of the first substrate;
       a second electrode, disposed on a part of the first substrate and kept a distance from the first electrode; and
       a metal bonding layer, disposed on a part of the first substrate, wherein the metal bonding layer does not contact the first electrode and the second electrode; and
    a light emitting diode chip, flipped on the package base and electrically connected with the package base, wherein the light emitting diode chip comprises:
       an epitaxy layer;
       a third electrode, disposed on a part of the epitaxy layer and contacting the first electrode;
       a fourth electrode, disposed on a part of the epitaxy layer and contacting the second electrode, wherein the fourth electrode is kept a distance from the third electrode;
       at least one second insulating layer, disposed on a part of the epitaxy layer and located between the third electrode and the fourth electrode; and
       a plurality of metal bonding pillars, disposed on the at least one second insulating layer and not contacting the third electrode and the fourth electrode, wherein at least a part of the metal bonding pillars contact the metal bonding layer.

11. The flip chip package structure as claimed in claim 10, wherein the package base further comprises a first insulating layer disposed between the first substrate and the metal bonding layer, and located between the first electrode and the second electrode.

12. The flip chip package structure as claimed in claim 10, wherein the light emitting diode chip further comprises a second substrate, and the third electrode, the fourth electrode, and the second insulating layer are disposed on one surface of the epitaxy layer, and the second substrate contacts the other surface of the epitaxy layer.

13. The flip chip package structure as claimed in claim 10, wherein the at least one second insulating layer is a plurality of second insulating layers separated from each other, and each of the second insulating layers is connected to one of the metal bonding pillars.

14. The flip chip package structure as claimed in claim 10, wherein one side of the metal bonding layer away from the first insulating layer is substantially aligned with one side of the first electrode away from the first substrate, and one end of each of the metal bonding pillars away from the at least one second insulating layer is substantially aligned with one side of the third electrode away from the epitaxy layer.

15. The flip chip package structure as claimed in claim 10, wherein the first and third electrodes are P-type electrodes, and the second and fourth electrodes are N-type electrodes.

16. The flip chip package structure as claimed in claim 10, wherein the first substrate comprises a first surface and a second surface opposite to each other and a plurality of conductive through holes penetrating from the first surface to the second surface, the first electrode and the second electrode are disposed on the first surface and connected to the conductive through holes, and the package base further comprises a first pad and a second pad disposed on the second surface and connected to the conductive through holes.

17. A wafer level package structure, comprising a plurality of the flip chip package structures as claimed in claim 10.

* * * * *